(12) United States Patent
Lee et al.

(10) Patent No.: US 12,058,881 B2
(45) Date of Patent: Aug. 6, 2024

(54) DISPLAY DEVICE INCLUDING PROTRUDING STRUCTURE PROTRUDING FROM WINDOW AND MANUFACTURING METHOD THEREOF

(71) Applicant: Samsung Display Co., LTD., Yongin-si (KR)

(72) Inventors: Dong Hyeon Lee, Seoul (KR); Jong In Ahn, Seoul (KR); Chang Moo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 164 days.

(21) Appl. No.: 17/318,026

(22) Filed: May 12, 2021

(65) Prior Publication Data

US 2022/0102675 A1    Mar. 31, 2022

(30) Foreign Application Priority Data

Sep. 28, 2020    (KR) ......................... 10-2020-0126104

(51) Int. Cl.
*H10K 50/842* (2023.01)
*H10K 71/00* (2023.01)

(52) U.S. Cl.
CPC ......... *H10K 50/8426* (2023.02); *H10K 71/00* (2023.02)

(58) Field of Classification Search
CPC .................................................. H10K 50/8426
USPC ........................................................... 257/40
See application file for complete search history.

(56) References Cited

U.S. PATENT DOCUMENTS

2016/0266690 A1*  9/2016  Ahn ..................... G06F 3/0412
2017/0080680 A1*  3/2017  Lee ..................... G06F 1/1652

FOREIGN PATENT DOCUMENTS

| KR | 1020140139361 A | 12/2014 |
| KR | 1020150053084 A | 5/2015 |
| KR | 1020160050815 A | 5/2016 |
| KR | 1020190070740 A | 6/2019 |
| KR | 102015126 B1 | 8/2019 |

* cited by examiner

*Primary Examiner* — Xia L Cross
(74) *Attorney, Agent, or Firm* — CANTOR COLBURN LLP

(57) ABSTRACT

A display device includes: a window; a display panel disposed on a rear surface of the window; an adhesive layer disposed between the window and the display panel and attaching the display panel to the window; and a protruding structure that protrudes from the rear surface of the window and includes a first surface facing the adhesive layer.

9 Claims, 15 Drawing Sheets

DISPLAY DEVICE INCLUDING PROTRUDING STRUCTURE PROTRUDING FROM WINDOW AND MANUFACTURING METHOD THEREOF

This application claims priority to Korean Patent Application No. 10-2020-0126104, filed on Sep. 28, 2020, and all the benefits accruing therefrom under 35 U.S.C. § 119, the content of which in its entirety is herein incorporated by reference.

BACKGROUND

(a) Field

This disclosure relates to a display device and a manufacturing method thereof.

(b) Description of the Related Art

A display device such as a light emitting display device and a liquid crystal display is applied to an electronic device such as a smart phone, a mobile phone, and a multimedia terminal. Since the display device, particularly a screen of the display device, is exposed to an outside of the electronic device, the display device is a key element in a design of the electronic device.

Typically, the screen of the display device is flat. Recently, as a flexible display device has been developed, the screen is not limited to a flat surface, but may be formed as a curved surface. Particularly, when an edge of the display device is formed as a curved surface, a screen-to-body ratio of the display device may be increased. The screen-to-body ratio may reflect a technology level of the display device, and may play an important role in consumers product selection.

SUMMARY

Embodiments provide a display device with a curved display area having an increased screen-to body ratio, and a manufacturing method thereof. In embodiments of a display device having a curved display area, an adhesive layer is effectively prevented from leaking out in a manufacturing process thereof.

An embodiment of a display device includes: a window; a display panel disposed on a rear surface of the window; an adhesive layer disposed between the window and the display panel, where the adhesive layer attaches the display panel to the window; and a protruding structure which protrudes from the rear surface of the window and includes a first surface facing the adhesive layer.

In an embodiment, the protruding structure may extend along one edge of the window.

In an embodiment, the first surface of the protruding structure may be in contact with an edge of the adhesive layer.

In an embodiment, the protruding structure may have a same thickness as the adhesive layer.

In an embodiment, the protruding structure may be integrally formed with the window as a single unitary unit.

In an embodiment, the protruding structure may be bonded or attached to the window.

In an embodiment, the window may include a flat area and a curved area, and the protruding structure may protrude from a rear surface of the curved area.

In an embodiment, the display panel may include a bending region, and the protruding structure may include a second surface opposite to the first surface and a third surface facing the bending region.

In an embodiment, the display panel may include a bending protection layer disposed in the bending region, and the third surface of the protruding structure may be in contact with the bending protection layer.

In an embodiment, the display panel may include a curved display area and a connection region extending from the curved display area, and the bending region may be disposed between the curved display area and the connection region.

An embodiment of a manufacturing method of a display device includes: providing an adhesive layer on a front surface of a display panel or on a rear surface of a window; disposing a blocking film between the display panel and the window; attaching the display panel to the window in a state in which the adhesive layer and the blocking film are disposed between the display panel and the window; and removing the blocking film.

In an embodiment, the disposing the blocking film may include attaching the blocking film to the display panel not to overlap the adhesive layer.

In an embodiment, an edge of the blocking film and an edge of the adhesive layer, which face each other, may contact each other in the attaching the display panel to the window.

In an embodiment, the blocking film may have a same thickness as the adhesive layer.

In an embodiment, the display panel may include a bending region, and the blocking film may be attached to the bending region.

In an embodiment, the display panel may include a bending protection layer disposed in the bending region, and the blocking film may be attached to the bending protection layer.

In an embodiment, the window may include a flat area and a curved area, and a portion of the blocking film may be disposed between the curved area and the display panel.

In an embodiment, the manufacturing method of the display device may further include: attaching a guide film to a rear surface of the display panel before the attaching the display panel to the window; and removing the guide film during the removing of the blocking film.

In an embodiment, the manufacturing method of the display device may further include bending the bending region after the removing the blocking film and the guide film.

In an embodiment, the attaching the display panel to the window may be performed by using a pressing pad.

According to embodiments of the invention, as disclosed herein, a display device may have an increased screen-to-body ratio and a curved display area. In such embodiments of the invention, an adhesive is effectively prevented from leaking out when a display device having a curved display area is manufactured.

DETAILED DESCRIPTION

Figure 1:
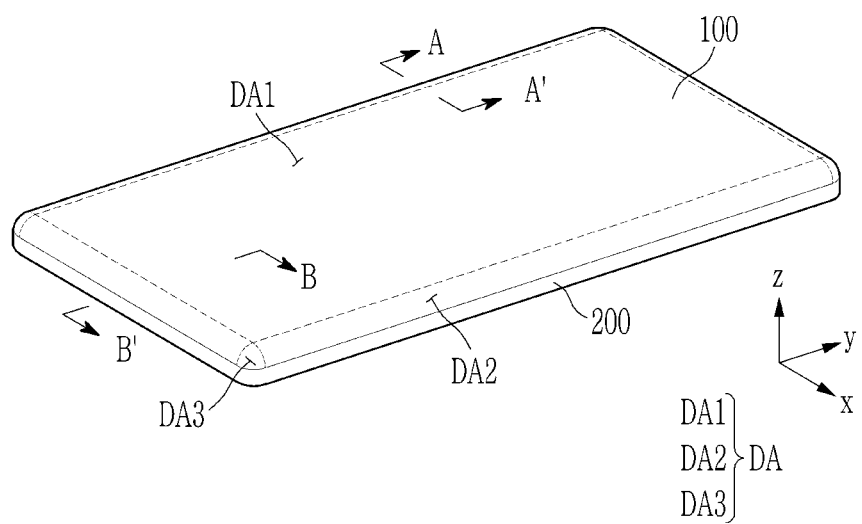
FIG. 1 illustrates a schematic perspective view of an electronic device including a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

A size and thickness of each element illustrated in the drawings are arbitrarily shown for ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Throughout the specification, "connected" does not mean only when two or more elements are directly connected, but when two or more elements are indirectly connected through other elements, and when they are physically connected or electrically connected, and further, it may be referred to with different names depending on a position or function, and may also be referred to as a case in which respective parts that are substantially integrated are linked to each other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the drawings, as symbols x, y, and z used for indicating directions, "x" is a first direction, "y" is a second direction perpendicular to the first direction, and "z" is a third direction perpendicular to the first direction and the second direction. The first direction (x), the second direction (y), and the third direction (z) may correspond to a horizontal direction, a vertical direction, and a thickness direction of the display device, respectively.

In the present specification, unless otherwise noted, "overlap" means overlapping when viewed in a plan view or overlapping in the third direction (z).

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 illustrates a schematic perspective view of an electronic device to which a display device according to an embodiment is applied.

Referring to FIG. 1, an embodiment of a display device 100 may be applied to or included in an electronic device such as a smart phone, a mobile phone, a tablet personal computer ("PC"), a multimedia player, or a game device. The electronic device may include the display device 100 and a housing 200. The display device 100 may provide a screen on which an image is displayed in the electronic device. The housing 200 may be referred to as a set frame, and may fix the display device 100. In an embodiment, various parts or elements of the electronic device may be disposed in an inner space defined by the display device 100 and the housing 200. In one embodiment, for example, a processor, a memory, a battery, a driving device, a camera, a speaker, a microphone, a receiver, a communication module, a sensor, etc. may be disposed inside the electronic device.

An entire front surface of the electronic device may correspond to the screen, and at least a portion of a side surface thereof may correspond to the screen. The screen may correspond to a display area DA of the display device 100. The display area DA may include a first display area DA1 defined in the front surface and second display areas DA2 respectively defined in side surfaces of the first display area DA1. The display area DA may further include third display areas DA3 defined at corners of the first display area DA1. The second display area DA2 and the third display area DA3 may be referred to as a side display area and a corner display area, respectively.

The first display area DA1 is disposed in a central area of the display device 100, and may occupy most of the screen. The first display area DA1 may be a flat area. The second display areas DA2 and the third display areas DA3 may be disposed around the first display area DA1. The second display areas DA2 and the third display areas DA3 may be curved display areas.

The first display area DA1 may occupy the greatest area in the entire display area DA. The first display area DA1 may be substantially flat, and may form or define a flat screen. In a plan view, the first display area DA1 may have a rectangular shape having four sides as a whole. The corners of the first display area DA1 may be pointed as shown in the drawing, but may also be rounded. The four sides of the first display area DA1 may be parallel to a first direction (x) or a second direction (y), respectively.

The second display areas DA2 may contact or extend from four sides of the first display area DA1. The second display area DA2 may be curved, and may form or define a curved screen. Curvatures of the second display area DA2 may be constant or different depending on positions on the curved surface. The second display area DA2 may have a shape similar to a portion (for example, ¼) of a side surface of a curved surface column, such as a substantially circular or an elliptical column.

The third display areas DA3 may be disposed at the four corners of the display device 100. Each third display area DA3 may be disposed between two adjacent second display areas DA2. The third display area DA3 may be curved, and may form or define a curved screen. Curvatures of the third display area DA3 may be constant or different depending on positions on the curved surface. A shape of the curved surface of the third display area DA3 may be different from that of the second display area DA2. The third display area DA3 may have a shape similar to a portion (for example, ⅛) of a curved body, such as a substantial sphere or ellipse.

Alternatively, the display device 100 may not include the third display area DA3, that is, no display area is defined at corners of the display device 100.

When the electronic device is viewed from the front, the entire first display area DA1 and at least some of the second and third display areas DA2 and DA3 are combined such that the screen may be recognized as a rectangular shape with rounded corners as a whole. The housing 200 may be invisible, or may be substantially invisible, such that the electronic device may be recognized as a substantially bezel-less electronic device with a screen-to-body ratio of about 1 in the plan view or when viewed in the third direction (z).

Figure 2:
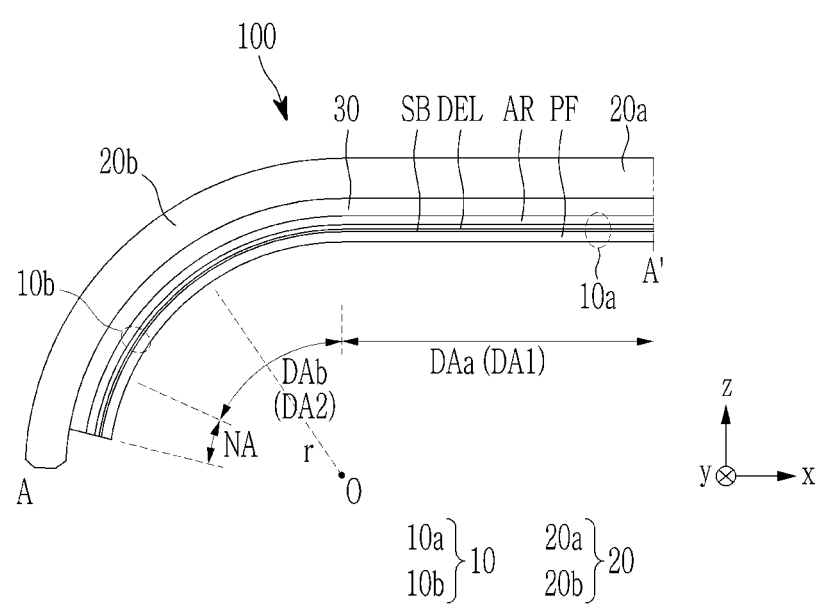
FIG. 2 illustrates a schematic cross-sectional view of the display device taken along line A-A' in FIG. 1.
Figure 3:
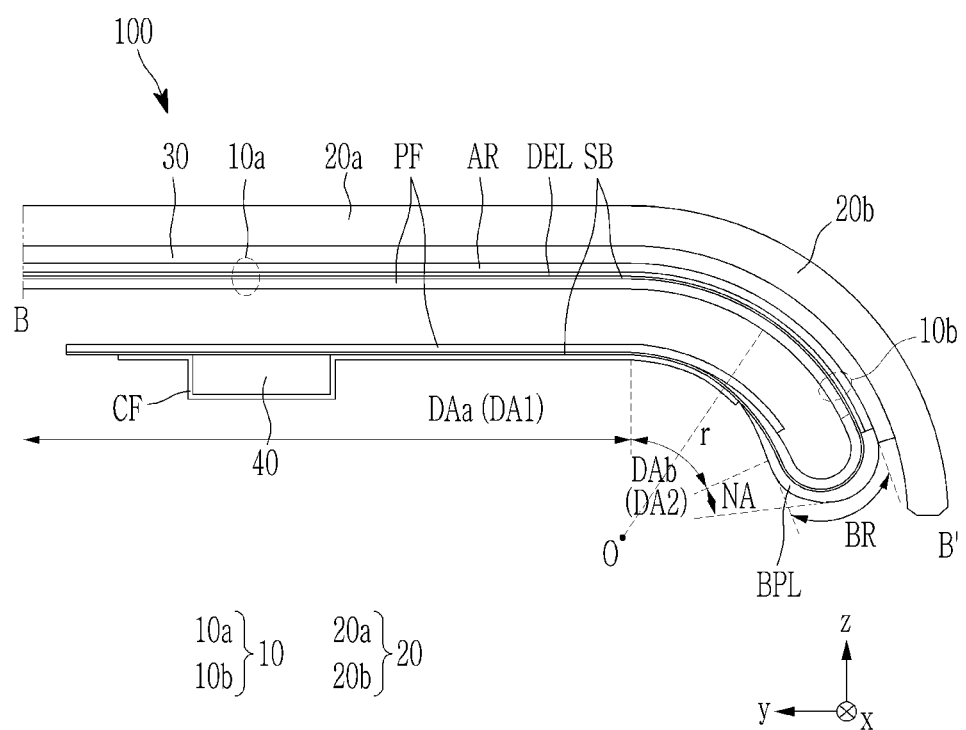
FIG. 3 illustrates a schematic cross-sectional view of the display device taken along line B-B' in FIG. 1.
Figure 4:
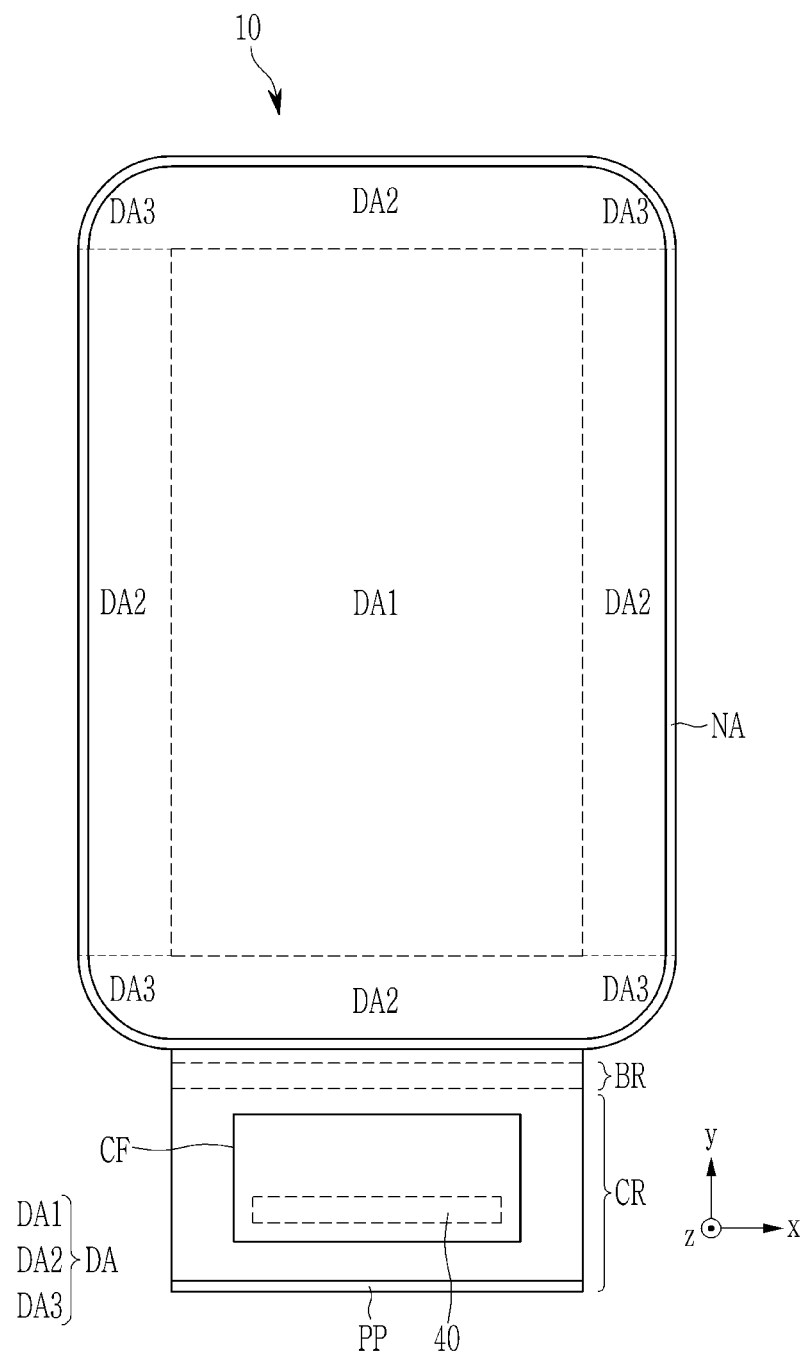
FIG. 4 illustrates a schematic top plan view of a display panel according to an embodiment.

FIG. 2 illustrates a schematic cross-sectional view of the display device 100 taken along line A-A' in FIG. 1, and FIG. 3 illustrates a schematic cross-sectional view of the display device 100 taken along line B-B' in FIG. 1. FIG. 4 illustrates a schematic top plan view of a display panel 10 according to an embodiment.

Referring to FIG. 2, FIG. 3, and FIG. 4, an embodiment of the display device 100 may include the display panel 10, a window 20, and an adhesive layer 30. FIG. 4 illustrates the display panel 10 before being attached to the window 20.

In an embodiment of the display device 100, an image may be displayed by the display panel 10, and the window 20 may transmit an image displayed on the display panel 10 while covering the display panel 10. Therefore, the first display area DA1, the second display areas DA2, and the third display areas DA3 of the display device 100 may be the same as or correspond to the first display area DA1, the second display areas DA2, and the third display areas DA3 of the display panel 10.

The display panel 10 may include a display area DA for displaying an image, and a non-display area NA around the display area DA. The display panel 10 may be at least partially flexible.

The display panel 10 may include a substrate SB. The substrate SB may be a flexible substrate that may be bent, folded, or rolled. The substrate SB may include a polymer layer including or made of a polyimide, a polyamide, or a polyethylene terephthalate. The substrate SB may include a barrier layer for preventing penetration of moisture, oxygen, and the like. In one embodiment, for example, the substrate SB may include at least one polymer layer and at least one barrier layer, and the polymer layer and the barrier layer may be alternately stacked one on another.

The display panel 10 may include a display element layer DEL including pixels, and pixel circuits and signal lines for driving the pixels, disposed on the substrate SB. The display panel 10 may display an image by a combination of light emitted from pixels. The pixels may be arranged in the first display area DA1 as well as in the second display areas DA2 and the third display areas DA3. The pixels may be implemented by light emitting elements such as light emitting diodes. The pixel circuits may include transistors and capacitors. The signal lines may be connected to the pixel circuits. The signal lines may include data lines, gate lines, driving voltage lines, and the like. The configuration of the display element layer DEL will be described later in greater detail.

The display panel 10 may include a touch sensor layer (not shown) for detecting a user's touch information.

The display panel 10 may include an anti-reflection layer AR on the display element layer DEL. The anti-reflection layer AR may include a polarizing layer. The anti-reflection layer AR may be implemented as a combination of layers such as a light blocking layer and a color filter.

The display panel 10 may include a protection film PF under the substrate SB. The protection film PF may include or be made of a polymer such as a polyethylene terephthalate, a polyethylene naphthalate, or a polyimide. In an embodiment, the protection film PF may not be disposed in the bending region BR to reduce bending stress of a bending region BR. A bending protection layer BPL may be disposed in the bending region BR so that wires disposed in the bending region BR are not disconnected or damaged. The bending protection layer BPL may reduce tensile stress of the wires, and may be referred to as a stress neutralization layer. The bending protection layer BPL may include an organic insulating material such as an acryl resin.

The display panel 10 may include a pad portion PP in which pads for receiving signals (including a power source) from an outside are arranged. Signals (for example, touch detection signals) generated by the display panel 10 may be outputted to the outside through the pad portion PP. The display panel 10 may include a connection region CR extending from one of the second display areas DA2, and the pad portion PP may be disposed at an end of the connection region CR. Connection wires for transmitting signals to a pixel circuit or the like may be disposed in the connection region CR. The connection region CR may have an approximately quadrangular planar shape.

The display panel 10 may include the bending region BR between the second display area DA and the connection region CR. The bending region BR may be disposed or extend in the first direction (x). The bending region BR may be bent so that the connection region CR is disposed on a rear surface of the display panel 10. The bending region BR may be bent to have an inner diameter of about 1 millimeter (mm) or less or about 0.5 mm or less, for example about 0.3 mm, with a bending axis parallel to the first direction (x) as a reference. The bending region BR and the connection region CR may be included in the non-display area NA.

The window 20 is a type of cover to protect the display panel 10 from external impact. The window 20 may serve as a supporter to maintain a curved state of the display panel 10. The window 20 may include or be made of a transparent and hard material such as glass or plastic so that a user can see an image displayed on the screen of the display panel 10.

The display device 100 may include a driving device that generates and/or processes various signals for driving the display panel 10. The driving device may include a data driver for applying a data voltage to a data line, a gate driver for applying a gate signal to a gate line, and a signal controller for controlling the data driver and the gate driver. The gate driver may be integrated as a driving circuit outside the second display area DA2 in the display panel 10. The data driver and the signal controller may be provided as an integrated circuit chip 40. The integrated circuit chip 40 may be mounted on the connection region CR of the display panel 10, and may be disposed between the bending region BR and the pad portion PP. Alternatively, the integrated circuit chip 40 may be mounted on a flexible printed circuit film (not shown) connected to the pad portion PP of the display panel 10. The integrated circuit chip 40 may be covered with a cover film CF to be protected from an external environment.

The display device 100 may be flat in the first display area DA1, and may be curved with a predetermined curvature in the second display areas DA2 and the third display areas DA3. The flat first display area DA1 may be a flat display area DAa. The curved second and third display areas DA2 and DA3 may be curved display areas DAb. A radius of curvature (r) of the curved display area DAb may be constant or changed depending on positions thereof. The display panel 10 may include a flat area 10a and the window 20 may include a flat area 20a to correspond to the flat display area DAa of the display device 100. The display panel 10 may include a curved area 10b and the window 20 may include a curved area 20b to correspond to the curved display area DAb. In a cross-section view, a curvature center of the curved area 20b of the window 20 may coincide or almost coincide with a curvature center O of the curved area 10b of the display panel 10. A radius of curvature of the curved area 20b of the window 20 may be greater than a radius of curvature (r) of the curved area 10b of the display panel 10.

The display panel 10 may be attached to the window 20 by an adhesive such as an optically clear adhesive ("OCA") or an optically clear resin ("OCR"), and the adhesive layer 30 may be disposed between the display panel 10 and the window 20. The flat area 10a of the display panel 10 may be attached to the flat area 20a of the window 20, and the curved area 10b of the display panel 10 may be attached to the curved area 20b of the window 20. An entire flat area 10a of the display panel 10 may be the first display area DA1. The curved area 10b of the display panel 10 is mostly the second and third display areas DA2 and DA3, but may include the non-display area NA outside the second and third display areas DA2 and DA3.

The bending region BR and connection area CR of the display panel 10 are disposed on a rear surface of the window 20, but may not be attached to the window 20, and may be disposed to rear surfaces of the flat area 10a and the curved area 10b of the display panel 10 (hereinafter, unless otherwise specified, referred to as the rear surface of the display panel 10). The connection region CR may have a shape corresponding to the curved area 10b of the display panel 10, and may be disposed to be close to or to closely contact the rear surface of the display panel 10.

An embodiment of a manufacturing method of the display device 100, including a method of attaching the display panel 10 to the window 20, will hereinafter be described with reference to FIG. 5 to FIG. 11. In such an embodiment, the same like elements as those of the display device 100 described above with reference to FIG. 1 to FIG. 4 will have been labeled with the same reference characters, and any repetitive detailed description thereof will hereinafter be omitted or simplified.

Figure 5:
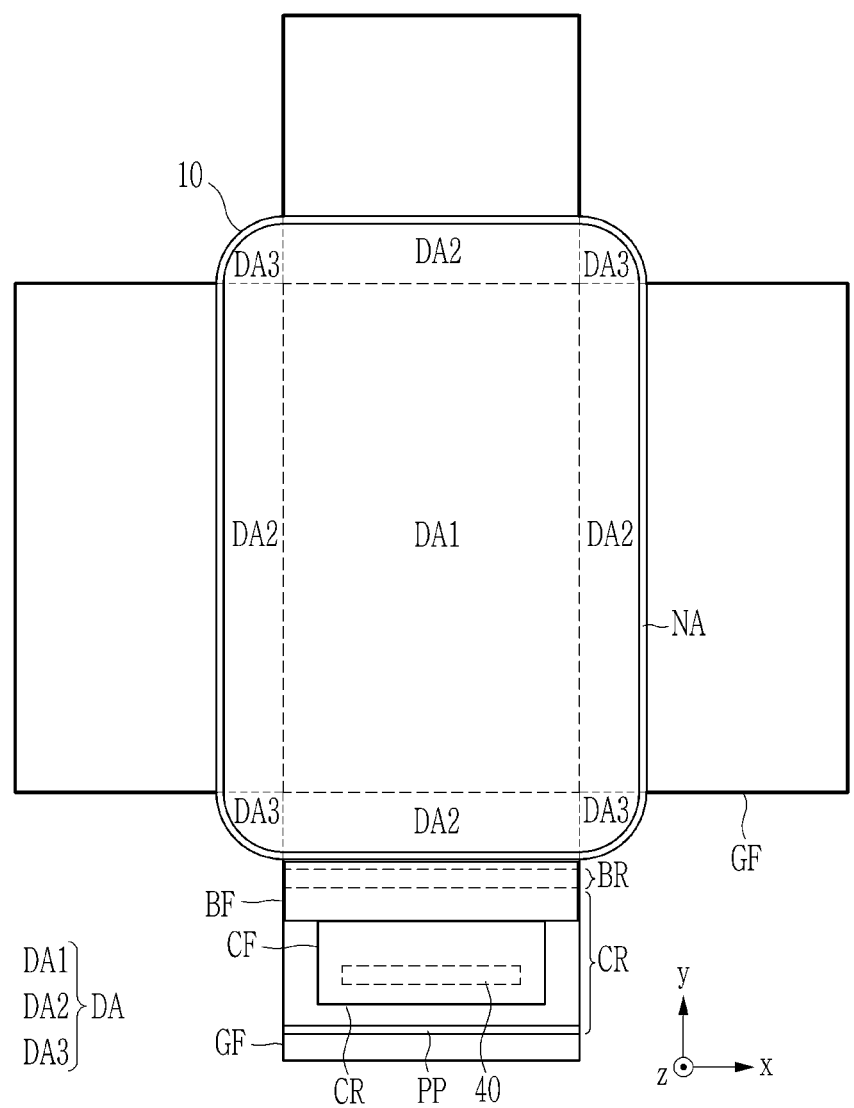
FIG. 5, FIG. 6, FIG. 7, FIG. 8, FIG. 9, FIG. 10, and FIG. 11 illustrate schematic views related to a manufacturing method of a display device according to an embodiment.
Figure 6:
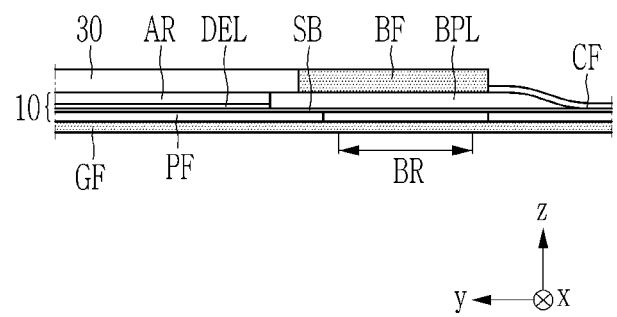
Figure 7:
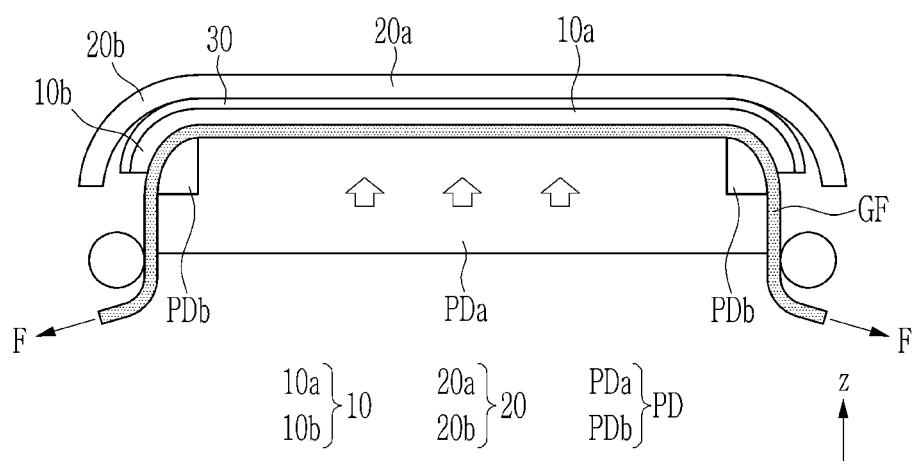
Figure 8:
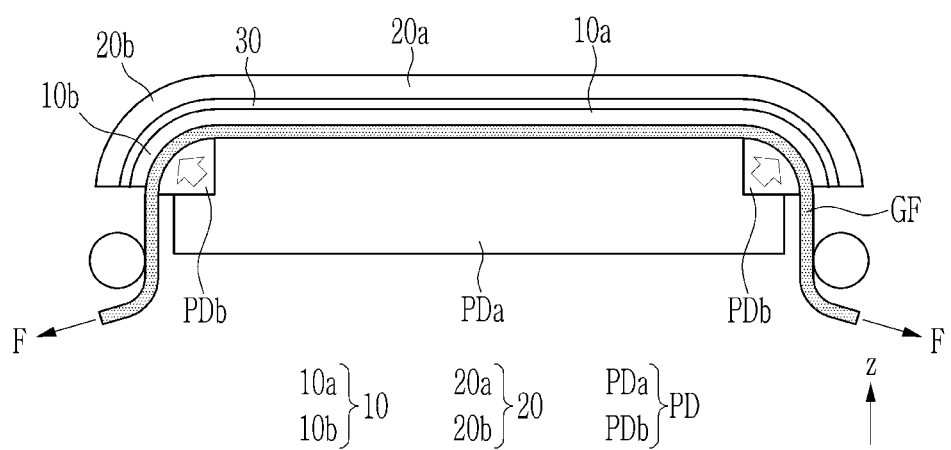
Figure 9:
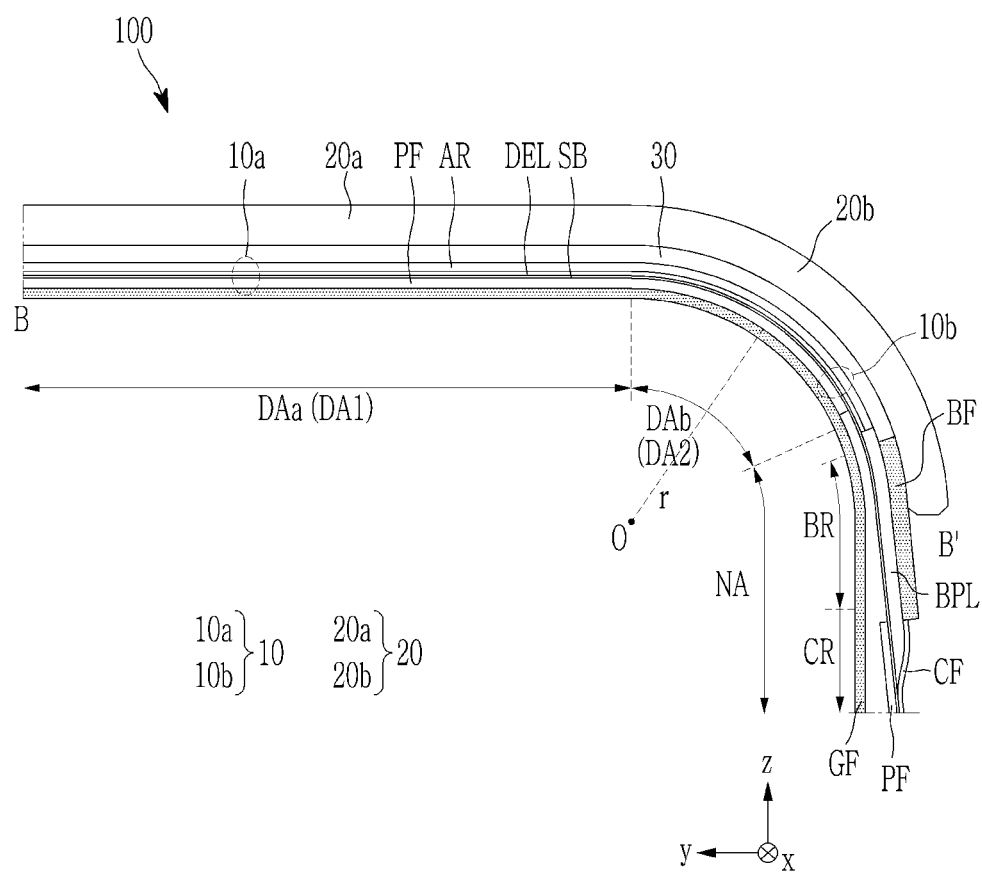
Figure 10:
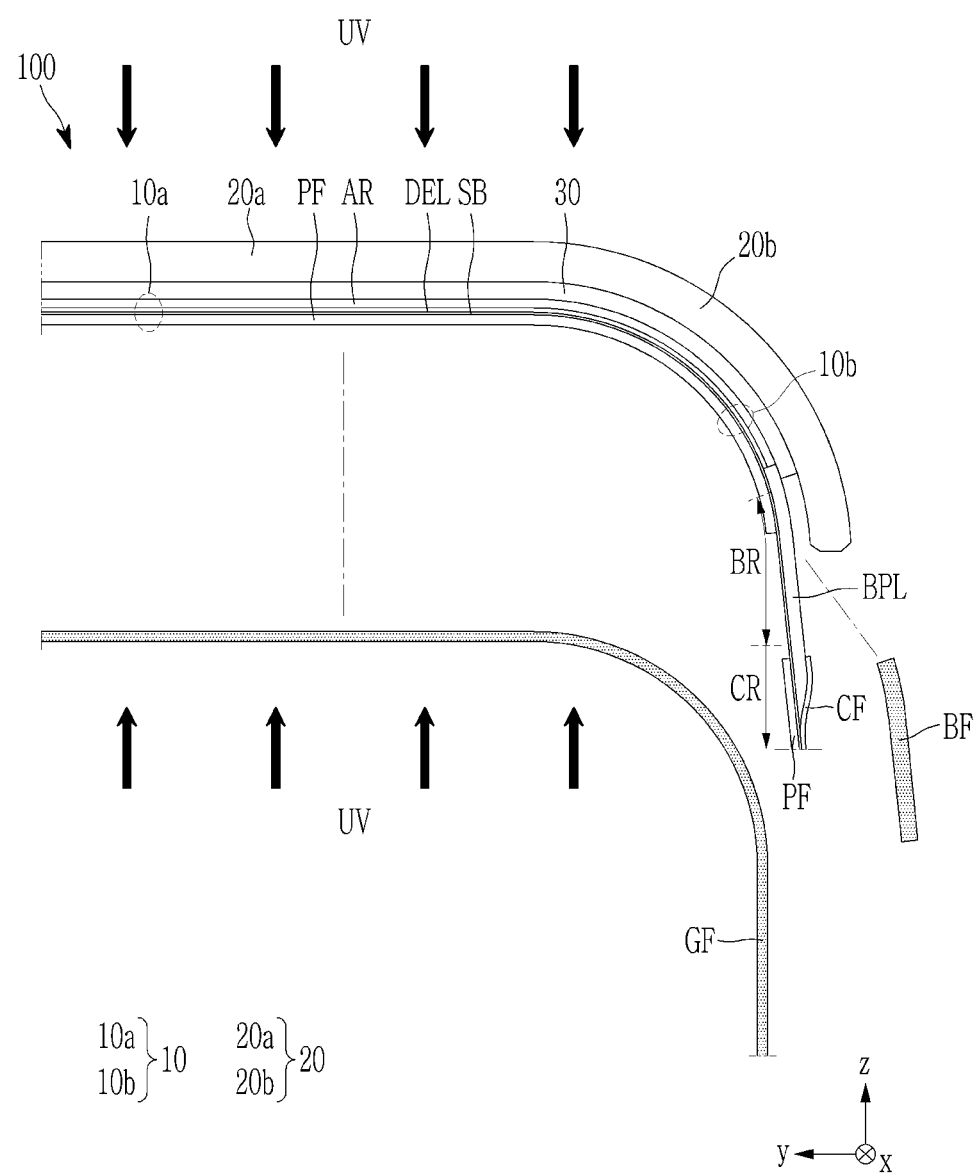
Figure 11:
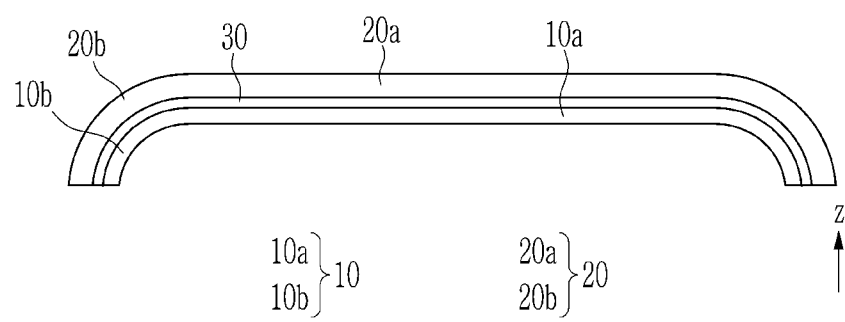

FIG. 5, FIG. 6, FIG. 7, FIG. 8, FIG. 9, FIG. 10, and FIG. 11 illustrate schematic views related to a manufacturing method of a display device according to an embodiment. FIG. 7, FIG. 8, and FIG. 11 briefly illustrate the display panel 10 as a single layer for convenience of illustration, and FIG. 6, FIG. 9, and FIG. 10 illustrate the vicinity of the bending region BR of the display panel 10 in detail.

Referring to FIG. 5 and FIG. 6, the adhesive layer 30 may be provided or formed on the front surface of the display panel 10. The adhesive layer 30 may be provided by attaching an adhesive in a form of a film such as an OCA, or formed by applying or coating an adhesive such as an OCR. The adhesive layer 30 may be provided or formed in both the flat area 10a and the curved area 10b of the display panel 10. In such an embodiment, the adhesive layer 30 may be formed in the first display area DA1, the second display areas DA2, and the third display area DA3 of the display panel 10.

In an embodiment, as shown in FIG. 7 and FIG. 8, a guide film GF may be attached to the rear surface of the display panel 10. The guide film GF may be attached to at least a portion of the display area DA, but may not be attached to the bending region BR and the connection region CR. The guide film GF may be attached to the first display area DA1 and the second display area DA2 of the display panel 10. The guide film GF may not be attached to the third display areas DA3 of display panel 10. The guide film GF may completely cover the second display areas DA2, and may have a large size to sufficiently extend outside the second display areas DA2.

In an embodiment, as shown in FIG. 9, a blocking film BF may be attached to the front surface of display panel 10. The blocking film BF may be attached not to overlap the adhesive layer 30. The blocking film BF may be attached to directly contact or be adjacent to an edge of the adhesive layer 30. The blocking film BF may be disposed on the bending region BR, and may be disposed on the bending protection layer BPL. The blocking film BF may be disposed between the adhesive layer 30 and a cover film CF. The blocking film BF may prevent an adhesive of the adhesive layer 30 from leaking out. The blocking film BF may have a same or substantially the same thickness as the adhesive layer 30. In one embodiment, for example, the blocking film BF may have a thickness in a range of about 100 micrometers (μm) to 200 μm. The blocking film BF may include or be made of various materials such as a polymer film and a metal film.

Referring back to FIG. 7, in a lamination process, the window 20 may be fixed to a jig or the like, and lamination may be performed in a vacuum chamber. A lamination apparatus may include a pressing pad PD that includes a first pressing pad PDa positioned at a center thereof and a second pressing pad PDb positioned at an edge of the first pressing pad PDa. The first pressing pad PDa may have a flat surface, and the second pressing pad PDb may have a curved surface. A jig (not shown) may be positioned under the pressure pad PD.

The first pressing pad PDa may have a high modulus, and the second pressing pad PDb may have a low modulus. The modulus of the second pressing pad PDb is less than the modulus of the first pressing pad PDa, so that a shape thereof may more easily changed. The second pressing pad PDb may be disposed along an edge of an upper portion of the first pressing pad PDa. The second pressing pad PDb may include an air pump or may be connected to an air pump, so that a shape and volume of the second pressing pad PDb may be changed according to an air pressure. The second pressing pad PDb may be a diaphragm. The first pressing pad PDa may be mainly used to attach the first display area DA1, and the second pressing pad PDb may be mainly used to attach the second and third display areas DA2 and DA3.

The display panel 10 with the guide film GF attached to the rear surface thereof and with the blocking film BF attached to the bending region BR thereof may be disposed on the pressing pad PD. At least a portion of the blocking film BF may be disposed between the curved area 20b of the window 20 and the bending region BR of the display panel 10. When a tensile force F is applied to the guide film GF, the second and third display areas DA2 and DA3 of the display panel 10 may form the curved area 10b. When the second pressing pad PDb includes an air pump or is connected to an air pump, the second pressing pad PDb may be in a state of having a small or minimum volume with a low or minimum air pressure.

Subsequently, the flat area 10a of the display panel 10 may be attached to the flat area 20a of the window 20 by lifting the first pressing pad PDa. In such an embodiment, a direction of the guide film GF may be adjusted so that the adhesive layer 30 provided or formed on the curved area 10b of the display panel 10 does not contact the curved area 20b of the window 20, as shown in FIG. 7. The first pressing pad PDa may be lifted by lifting a jig under the pressing pad PD.

Referring to FIG. 8, a volume of the second pressing pad PDb may be increased in a state in which the tensile force F is applied to the guide film GF. When the volume of the second pressing pad PDb increases, the adhesive layer 30 provided or formed on the curved area 10b of the display panel 10 contacts the curved area 20b of the window 20 and is in close contact with the curved area 20b, so that the curved area 10b may be attached to the curved area 20b. In an embodiment, where the second pressing pad PDb is a diaphragm, the volume of the second pressure pad PDb may be increased by increasing the air pressure of the second pressing pad PDb. Accordingly, the curved area 10b of the display panel 10 may be in close contact with and attached to the curved area 20b of the window 20. In such an embodiment, where the second pressing pad PDb has higher elasticity than that of the first pressing pad PDa, the magnitude or direction of the tensile force of the guide film GF may be adjusted so that the volume of the second pressing pad PDb may be increased.

The tensile force F applied to the guide film GF may be applied until the curved area 10b of the display panel 10 is attached to the curved area 20b of the window 20. In such an embodiment, when the curved area 10b of the display panel 10 is attached, the first pressing pad PDa may be in close contact with the flat area 10a of the display panel 10 to prevent deformation of the flat area 10a of the display panel 10 that has already been attached to the flat area 20a of the window 20.

When being pressed by the pressing pad PD, the display panel 10 may be in close contact with the window 20, and the adhesive layer 30 between the display panel 10 and the window 20 may also be pressed. Accordingly, the adhesive layer 30 may be more widely distributed than that before being pressed. In such an embodiment, as the adhesive layer 30 is pressed during the lamination process, the adhesive of the adhesive layer 30 may be pushed out or leaked out of the display panel 10. In such an embodiment, the adhesive that has been pushed out to the vicinity of the bending region BR may be spread when the bending region BR is bent, thus an area in which the adhesive is exposed to the outside may increase, and the adhesive may not be evenly distributed. Accordingly, foreign matters may be attached to the adhesive, or the adhesive may fall off in a subsequent process, resulting in defects, and further resulting in defects even when assembling electronic devices. Referring to FIG. 9, in an embodiment of the invention, the blocking film BF is disposed between the bending region BR of the display panel 10 and the curved area 20b of the window 20, even if the adhesive layer 30 is pressed, the adhesive is blocked by the blocking film BF such that the adhesive is effectively prevented from being pushed out or leaking out of the bending region BR. Therefore, in such an embodiment, even if the bending region BR is bent, the above-described defects due to the push-out of the adhesive may be effectively prevented. When being pressed by the pressing pad PD and/or after being pressed, an edge of the blocking film BF and an edge of the adhesive layer 30 that face each other may be in contact with each other.

Referring to FIG. 10, after the display panel 10 is attached to the window 20, the adhesive layer 30 may be cured by radiating ultraviolet rays onto the adhesive layer 30. For easy or effective removal of the guide film GF and the blocking film BF, the guide film GF and the blocking film BF may be attached to the display panel 10 by an adhesive, of which adhesive force is deteriorated as the ultraviolet UV rays are radiated. Therefore, the guide film GF and the blocking film BF may be separated during ultraviolet radiation for curing the adhesive layer 30.

By separating the guide film GF and the blocking film BF attached to the rear surface and the bending region BR of the display panel 10, as shown in FIG. 11, the display device 100 in which the display panel 10 is attached to the window 20 by the adhesive layer 30 may be manufactured. After the display panel 10 is attached to the window 20, the connection region CR of the display panel 10 may be unfolded. Thereafter, by bending the bending region BR of the display panel 10, as shown in FIG. 3, the display device 100 in which the pad portion PP of the display panel 10 is disposed on the rear surface of the display panel 10 may be manufactured.

In an embodiment, the adhesive layer 30 may be provided or formed on the front surface of the display panel 10 and the display panel 10 may be attached to the window 20 as described, but not being limited thereto. Alternatively, the adhesive layer 30 may be provided or formed on the rear surface of the window 20. In an embodiment, as described above, the flat area 10a may be attached and then the curved area 10b may be attached, but not being limited thereto. Alternatively, the flat area 10a and the curved area 10b may be simultaneously attached. In one embodiment, for example, the pressing pad PD may be operated so that the flat area 10a and the curved area 10b of the display panel 10 are simultaneously attached to the flat area 20a and the curved area 20b of the window 20. The blocking film BF may be attached to the curved area 20b of the window 20.

In an embodiment, a flexible printed circuit film (or flexible printed circuit board) may be bonded to the pad part PP that may be disposed at an edge of the connection region CR, and the flexible printed circuit film may be disposed on the rear surface of the display panel 10. The integrated circuit chip 40 may be disposed on the flexible printed circuit film.

Figure 12A:
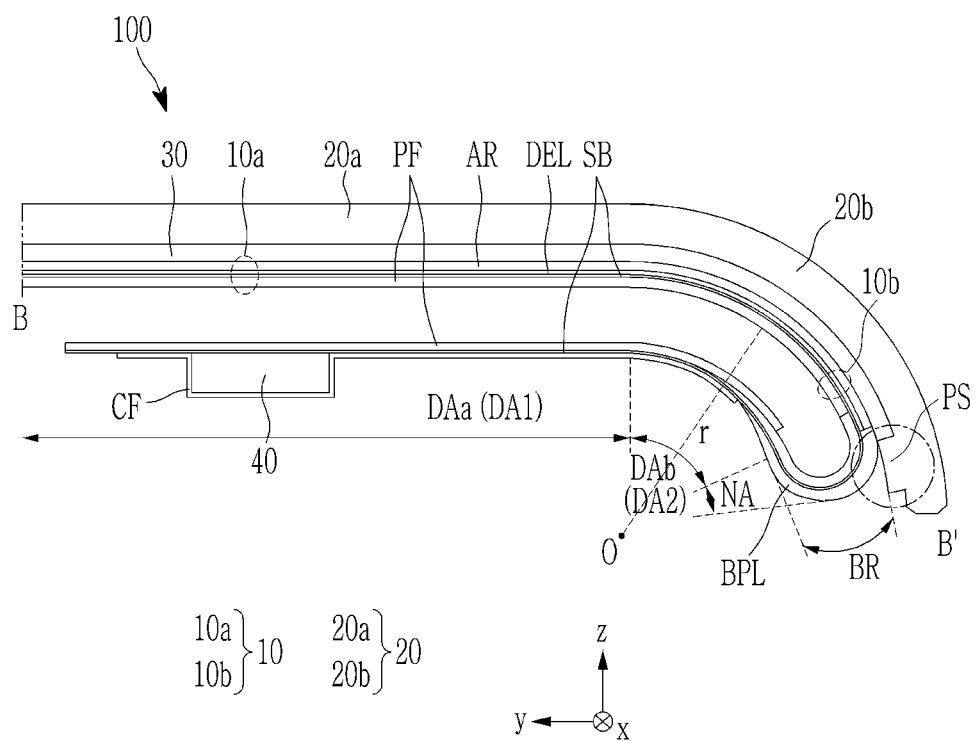
FIG. 12A, FIG. 12B and FIG. 13 respectively illustrate a schematic cross-sectional view of a display device according to an alternative embodiment.
Figure 12B:
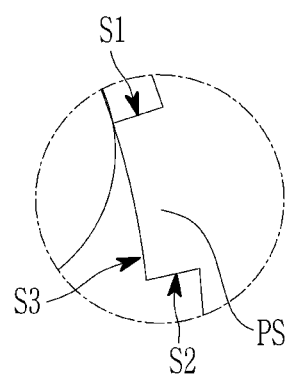

FIG. 12A illustrates a schematic cross-sectional view of a display device according to an alternative embodiment, and FIG. 12B is an enlarged view of the encircled portion of FIG. 12A.

FIG. 12A illustrates a cross-section near the bending region BR in the display device 100 according to the embodiment. The display device 100 illustrated in FIG. 12A and FIG. 12B is substantially the same as the display device 100 illustrated in FIG. 3 except for a shape of the window 20. The same or like elements shown in FIGS. 12A and 12B have been labeled with the same reference characters as used above to describe the embodiment of the display device 100 shown in FIG. 3, and any repetitive detailed description thereof will hereinafter be omitted or simplified.

In an embodiment, as shown in FIGS. 12A and 12B, the window 20 of the display device 100 may include a protruding structure PS protruding from the rear surface of the window 20 near the edge of the curved area 20b. The protruding structure PS may extend or be formed to be long in the first direction (x) along one edge of the window 20 on the rear surface of the curved area 20b of the window 20. In an embodiment, as shown in FIG. 12B, the protruding structure PS may include a first surface 51 facing the adhesive layer 30, a second surface S2 opposite to the first surface 51, and a third surface S3 facing the bending region BR of the display panel 10. The first surface 51 may be in contact with an edge of the adhesive layer 30. A portion of the third surface S3 may contact the bending protection layer BPL. The protruding structure PS may have a same or substantially the same thickness as that of the adhesive layer 30.

As describe above with reference to the blocking film BF, the protruding structure PS may effectively prevent the adhesive of the adhesive layer 30 from being pushed out or spilled out of the display panel 10 during the lamination process, particularly when pressed by the pressing pad PD. In an embodiment in which the blocking film BF is used, the blocking film BF may be removed after the lamination process. In an alternative embodiment, as described above, the protruding structure PS may be defined by a portion of the window 20 or a portion protruding from the window 20. The protruding structure PS may be integrally formed with the window 20 as a single unitary unit, and may be defined by a portion of the window 20.

Figure 13:
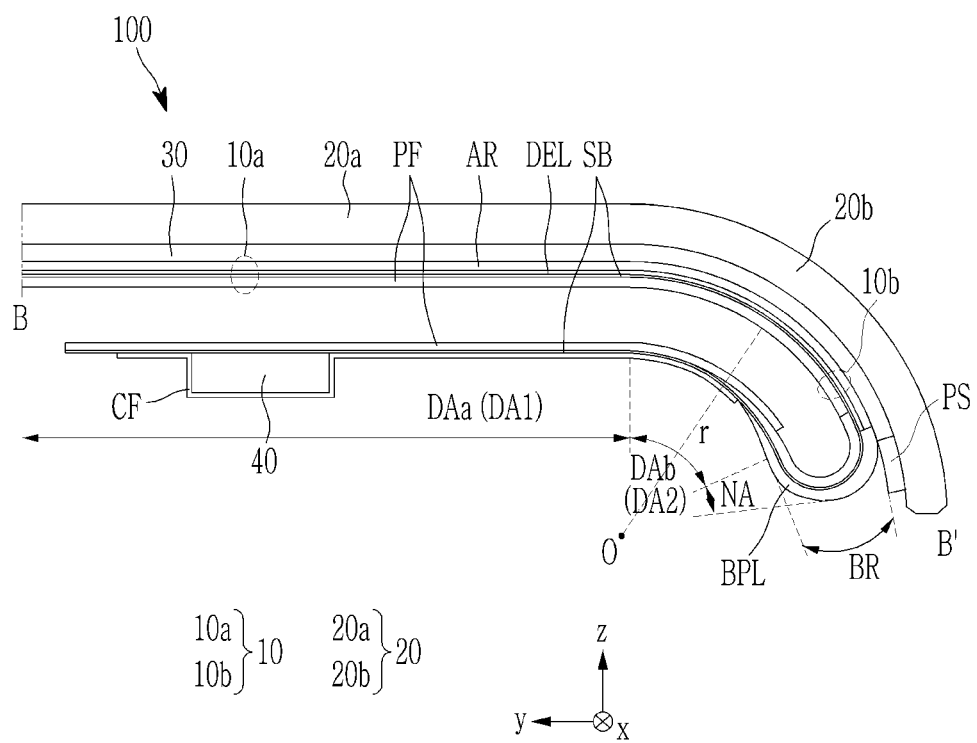

FIG. 13 illustrates a schematic cross-sectional view of a display device according to another alternative embodiment.

In an embodiment, as described above with reference to FIGS. 12A and 12B, the protruding structure PS and the window 20 are integrally formed with each other as a single unitary unit. In an alternative embodiment, the protruding structure PS may be prepared or formed separately from the window 20 to be bonded or attached to the window 20. After the lamination process, the protruding structure PS may remain in a state of being fixed to the window 20.

Figure 14:
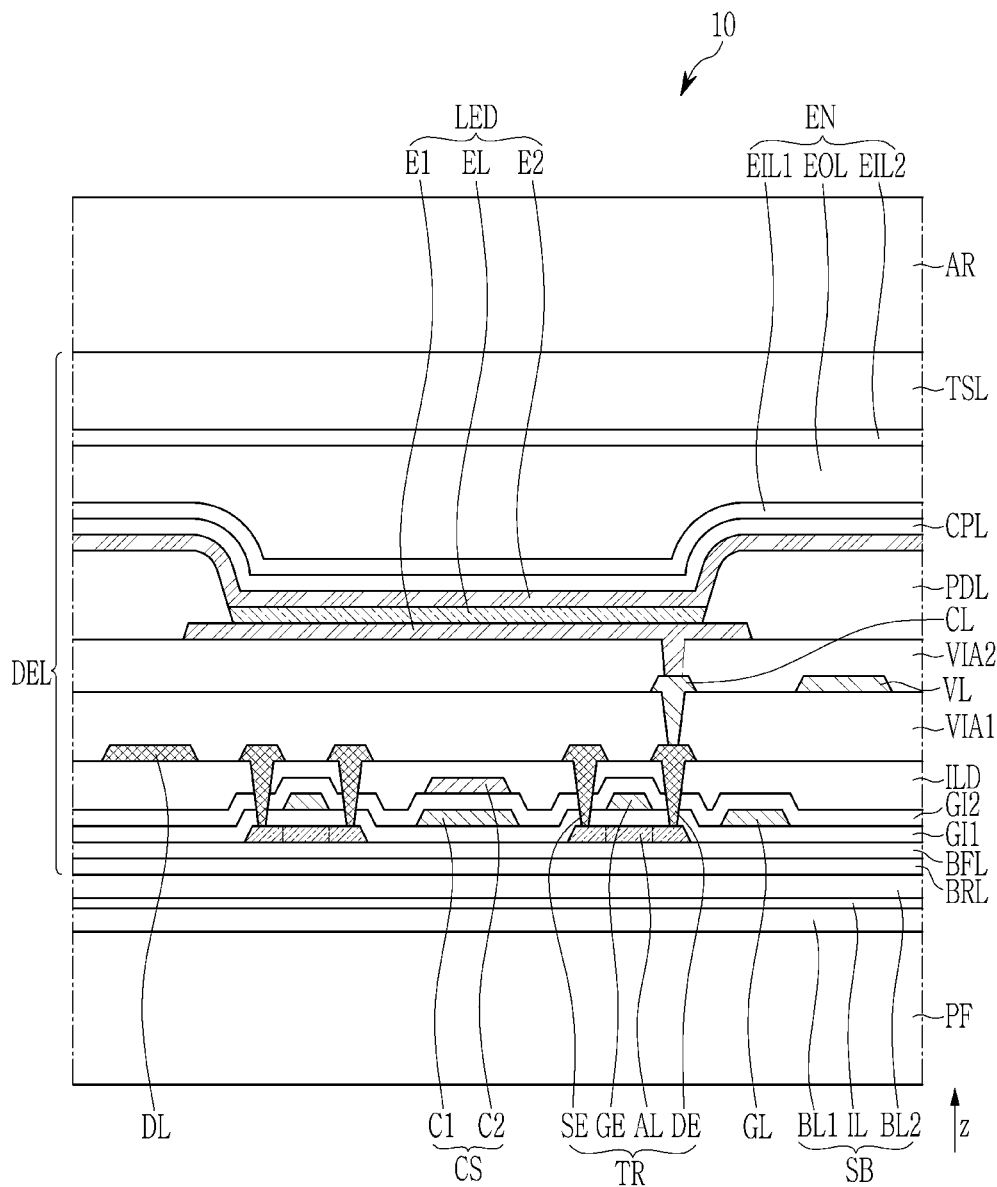
FIG. 14 illustrates a schematic cross-sectional view of a stacked structure of a display panel according to an embodiment.

FIG. 14 illustrates a schematic cross-sectional view of a stacked structure of a display panel according to an embodiment. The cross-section shown in FIG. 14 may substantially correspond to one pixel area.

In an embodiment, the display panel 10 may include a substrate SB, a transistor TR formed on the substrate SB, and a light emitting diode LED connected to the transistor TR. The light emitting diode LED may correspond to a pixel.

The substrate SB may have a multilayer structure including a first base layer BL1, an inorganic layer IL, and a second base layer BL2. The first and second base layers BL1 and BL2 may include a polymer resin such as a polyimide, a polyamide, and a polyethylene terephthalate, respectively.

A barrier layer BRL that prevents moisture, oxygen, etc. from penetrating may be disposed the substrate SB. The barrier layer BRL may include an inorganic material such as a silicon nitride ($SiN_x$), a silicon oxide ($SiO_x$), or a silicon oxynitride ($SiO_xN_y$), and may be a single layer or a multilayer.

A buffer layer BFL may be disposed on the barrier layer BRL. The buffer layer BFL may block impurities from the substrate SB when a semiconductor layer is formed, thereby improving characteristics of the semiconductor layer and flattening a surface of the substrate SB to reduce stress of the semiconductor layer. The buffer layer BFL may include an inorganic insulating material such as a silicon nitride, a silicon oxide, or a silicon oxynitride, and may be a single layer or a multilayer. The buffer layer BFL may include amorphous silicon ("a-Si").

A semiconductor layer AL of the transistor TR may be disposed on the buffer layer BFL. The semiconductor layer AL may include a first region, a second region, and a channel region between the regions. The semiconductor layer AL may include at least one selected from a-Si, polysilicon, and an oxide semiconductor. In one embodiment, for example, the semiconductor layer AL may include a low temperature polycrystalline silicon ("LTPS"), or an oxide semiconductor material including at least one selected from zinc (Zn), indium (In), gallium (Ga), and tin (Sn). In one embodiment, for example, the semiconductor layer AL may include an indium-gallium-zinc oxide ("IGZO").

A first gate insulation layer GI1 may be disposed on the semiconductor layer AL. The first gate insulation layer GI1 may include an inorganic insulating material such as a silicon nitride, a silicon oxide, or a silicon oxynitride, and may have a single layer structure or a multilayer structure.

A first gate conductive layer that may include a gate electrode GE of the transistor TR, a gate line GL, and a first electrode C1 of a capacitor CS may be disposed on the first gate insulation layer GI1. The first gate conductive layer may include molybdenum (Mo), aluminum (Al), copper (Cu), titanium (Ti), and the like, and may have a single layer structure or a multilayer structure.

A second gate insulation layer GI2 may be disposed on the first gate conductive layer. The second gate insulation layer GI2 may include an inorganic insulating material such as a silicon nitride, a silicon oxide, or a silicon oxynitride, and may have a single layer structure or a multilayer structure.

A second gate conductive layer that may include a second electrode C2 of the capacitor CS may be disposed on the second gate insulation layer GI2. The second gate conductive layer may include at least one selected from molybdenum (Mo), aluminum (Al), copper (Cu), titanium (Ti), and the like, and may have a single layer structure or a multilayer structure.

An interlayer insulation layer ILD may be disposed on the second gate insulation layer GI2 and the second gate conductive layer. The interlayer insulation layer ILD may include an inorganic insulating material such as a silicon nitride, a silicon oxide, or a silicon oxynitride, and may have a single layer structure or a multilayer structure.

A first data conductive layer that may include a first electrode SE and a second electrode DE of the transistor TR, and a data line DL, may be disposed on the interlayer insulation layer ILD. The first electrode SE and the second electrode DE may be respectively connected to the first region and the second region of the semiconductor layer AL through contact holes of the insulation layers GI1, GI2, and ILD. One of the first electrode SE and the second electrode DE may be a source electrode, and the other thereof may be a drain electrode. The first data conductive layer may include at least one selected from aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W) and copper (Cu), and may have a single layer structure or a multilayer structure.

A first planarization layer VIA1 may be disposed on the first data conductive layer. The first planarization layer VIA1 may be an organic insulation layer. In one embodiment, for example, the first planarization layer VIA1 may include an organic insulating material such as a general purpose polymer such as poly(methyl methacrylate) and polystyrene, a polymer derivative having a phenol-based group, an acryl-based polymer, an imide-based polymer, a polyimide, or a siloxane-based polymer, etc.

A second data conductive layer that may include a voltage line VL, a connection line CL, and the like, may be disposed on the first planarization layer VIA1. The voltage line VL may transmit a voltage such as a driving voltage, a common voltage, an initialization voltage, or a reference voltage. The connection line CL may be connected to the second electrode DE of the transistor TR through a contact hole defined through the first planarization layer VIA1. The second data conductive layer may include at least one selected from aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W) and copper (Cu), and may have a single layer structure or a multilayer structure.

A second planarization layer VIA2 may be disposed on the second data conductive layer. The second planarization layer VIA2 may be an organic insulation layer. In one embodiment, for example, the second planarization layer VIA2 may include an organic insulating material such as a general purpose polymer such as poly(methyl methacrylate) and polystyrene, a polymer derivative having a phenol-based group, an acryl-based polymer, an imide-based polymer, a polyimide, or a siloxane-based polymer, etc.

A first electrode E1 of the light emitting diode LED may be disposed on the second planarization layer VIA2. The first electrode E1 may be referred to as a pixel electrode. The first electrode E1 may be connected to the connection line CL through a contact hole defined through the second planarization layer VIA2. Therefore, the first electrode E1 may be electrically connected to the second electrode DE of the transistor TR to receive a data signal that controls luminance of the light emitting diode. The transistor TR to which the first electrode E1 is connected may be a driving transistor, or a transistor electrically connected to the driving transistor. In an embodiment, the first electrode E1 may include or be made of a reflective conductive material or a translucent conductive material, or the first electrode E1 may include or be made of a transparent conductive material. In an embodiment, the first electrode E1 may include a transparent conductive material such as an indium tin oxide ("ITO") or an indium zinc oxide ("IZO"). In an alternative embodiment, the first electrode E1 may include a metal such as lithium (Li), calcium (Ca), aluminum (Al), silver (Ag), magnesium (Mg), or gold (Au), or a metal alloy thereof.

A pixel defining layer PDL that may be an organic insulation layer may be disposed on the second planarization layer VIA2. The pixel defining layer PDL may be referred to as a partition wall, and an opening may be defined through the pixel defining layer PDL to overlap the first electrode E1.

An emission layer EL of the light emitting diode LED may be disposed on the first electrode E1. In addition to the emission layer EL, at least one of a hole injection layer, a hole transport layer, an electron transport layer, and an electron injection layer may be disposed on the first electrode E1.

A second electrode E2 of the light emitting diode LED may be disposed on the emission layer EL. The second electrode E2 may be referred to as a common electrode. In an embodiment, the second electrode E2 may have low light transmittance by forming a thin layer of a metal or a metal alloy having a low work function such as calcium (Ca), barium (Ba), magnesium (Mg), aluminum (Al), silver (Ag), or the like. Alternatively, the second electrode E2 may include a transparent conductive oxide such as an indium tin oxide ("ITO") or an indium zinc oxide ("IZO").

The first electrode E1, the emission layer EL, and the second electrode E2 of each pixel form a light emitting diode LED such as an organic light emitting diode ("OLED"). The first electrode E1 may be an anode of the light emitting diode, and the second electrode E2 may be a cathode of the light emitting diode.

A capping layer CPL may be disposed on the second electrode E2. The capping layer CPL may improve light efficiency through refractive index adjustment. The capping layer CPL may be disposed to entirely cover the second electrode E2. The capping layer CPL may include an organic insulating material or an inorganic insulating material.

An encapsulation layer EN may be disposed on the capping layer CPL. The encapsulation layer EN may encapsulate the light emitting diode LED to prevent moisture or oxygen from outside from penetrating therethrough. The encapsulation layer EN may be a thin film encapsulation layer including one or more of inorganic layers EIL1 and EIL2 and one or more of organic layers EOL.

A touch sensor layer TSL including touch electrodes may be disposed on the encapsulation layer EN. The touch electrodes may have a mesh shape with an opening overlapping a light emitting diode LED. An anti-reflection layer AR for reducing reflection of external light may be disposed on the touch sensor layer TSL.

The above-described display element layer DEL may include layers disposed between the substrate SB and the anti-reflection layer AR, and particularly, may include the transistor TR, the capacitor CS, and the light emitting diode LED.

A protection film PF for protecting the display panel 10 may be disposed under the substrate SB. A functional sheet (not shown) including at least one of a cushion layer, a heat dissipation sheet, a light blocking sheet, a waterproof tape, and an electromagnetic blocking layer may be disposed under the protection film.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a window;
    a display panel disposed on a rear surface of the window;
    an adhesive layer disposed between the window and the display panel, wherein the adhesive layer attaches the display panel to the window; and
    a protruding structure which protrudes from the rear surface of the window and includes a first surface facing the adhesive layer, wherein the protruding structure is separated from the adhesive layer, the protruding structure and the adhesive layer include different materials from each other, and the protruding structure and the window are continuously and uniformly formed by a same material.

2. The display device of claim 1, wherein
    the protruding structure extends along one edge of the window.

3. The display device of claim 1, wherein
    the first surface of the protruding structure is in contact with an edge of the adhesive layer.

4. The display device of claim 1, wherein
    the protruding structure has a same thickness as the adhesive layer.

5. The display device of claim 1, wherein
    the protruding structure is bonded or attached to the window.

6. The display device of claim 1, wherein
    the window includes a flat area and a curved area, and
    the protruding structure protrudes from a rear surface of the curved area.

7. The display device of claim 1, wherein
    the display panel includes a bending region, and
    the protruding structure includes a second surface opposite to the first surface and a third surface facing the bending region.

8. The display device of claim 7, wherein
    the display panel includes a bending protection layer disposed in the bending region, and
    the third surface of the protruding structure is in contact with the bending protection layer.

9. The display device of claim 7, wherein
    the display panel includes a curved display area and a connection region extending from the curved display area, and
    the bending region is disposed between the curved display area and the connection region.

* * * * *